(12) United States Patent
Saito et al.

(10) Patent No.: US 11,728,711 B2
(45) Date of Patent: Aug. 15, 2023

(54) MOTOR CONTROL DEVICE

(71) Applicant: OKUMA Corporation, Aichi (JP)

(72) Inventors: Masaru Saito, Aichi (JP); Motozumi Yura, Aichi (JP)

(73) Assignee: OKUMA CORPORATION, Aichi (JP)

( * ) Notice: Subject to any disclaimer, the term of this patent is extended or adjusted under 35 U.S.C. 154(b) by 98 days.

(21) Appl. No.: 17/173,572

(22) Filed: Feb. 11, 2021

(65) Prior Publication Data

US 2021/0249938 A1 Aug. 12, 2021

(30) Foreign Application Priority Data

Feb. 12, 2020 (JP) ................................ 2020-021677

(51) Int. Cl.
*H02H 3/04* (2006.01)
*H02K 11/21* (2016.01)
*G01R 31/50* (2020.01)
*G01R 31/34* (2020.01)

(52) U.S. Cl.
CPC ........... *H02K 11/21* (2016.01); *G01R 31/343* (2013.01); *G01R 31/50* (2020.01)

(58) Field of Classification Search
CPC ...... H02P 11/21; H02P 29/0243; H02P 27/06; H02K 11/21; G01R 31/50; G01R 31/343
See application file for complete search history.

(56) References Cited

FOREIGN PATENT DOCUMENTS

| CN | 114584031 A | * | 6/2022 | ............ H02P 7/0094 |
|---|---|---|---|---|
| JP | 2017208989 A | | 11/2017 | |
| JP | 2018133835 A | | 8/2018 | |
| WO | WO-2020026755 A1 | * | 2/2020 | ............ G01R 31/083 |

OTHER PUBLICATIONS

JPO Notice of Reasons for Refusal for corresponding JP Application No. 2020-021677; dated Jul. 4, 2023.

* cited by examiner

*Primary Examiner* — Karen Masih
(74) *Attorney, Agent, or Firm* — Cantor Colburn LLP

(57) ABSTRACT

A numeric value control unit outputs a connection diagnostic signal to a target position switching unit to place the three-phase motor in a position at an angle that causes no torque generation upon application of a diagnostic current to the three-phase motor, and thereafter, outputs a connection diagnostic signal to a current instruction switching unit to apply a diagnostic current. Then, in order to apply a diagnostic current to the other two phases, the three-phase motor is placed in a position at an angle that causes no torque generation upon second application of a diagnostic current, and a diagnostic current is thereafter applied. When a diagnostic current is applied twice and in the case where no defect in connection is detected in either application, it is determined that connection is normal. Meanwhile, in the case where connection is detected once or twice, it is determined that connection is defective.

6 Claims, 2 Drawing Sheets

MOTOR CONTROL DEVICE

CROSS REFERENCE TO RELATED APPLICATION

This present invention claims priority under 35 U.S.C. § 119 to Japanese Patent Application No 2020-021677 filed on Feb. 12, 2020, the entire content of which is incorporated herein by reference.

TECHNICAL FIELD

This disclosure relates to a motor control device that has a function of diagnosing a defect in connection between a motor and an inverter.

BACKGROUND

As a conventional technique for detecting a defect in connection between a motor control device and a motor, a variety of methods have been invented, including a conventional technique described in JP 2018-133835 A.

According to the conventional technique described in JP 2018-133835 A, a motor control device causes a diagnostic current to flow to a first phase of a three-phase AC motor so that the diagnostic current flows out from second and third phases to diagnose the state of disconnection of the three-phase AC motor relative to the inverter circuit, based on the values of currents flowing in the respective phases of the three-phase AC motor. This conventional technique enables diagnosis of the state of disconnection, using a regular current sensor provided between the motor and the inverter, without addition of a current sensor.

According to the above-described conventional technique, a regular inverter output voltage is applied to the first phase of the motor in a feed-forward manner to detect the flowing current. This conventional technique, however, has a problem in that the technique cannot detect abnormality with a low resistive value (for example, a resistive value equal to or smaller than 1Ω), such as a connector contact resistance, as a current for a first phase could vary due to variation in characteristics of a power semiconductor constituting the inverter or change of the value of resistance due to the length or temperature of a wire from the inverter to the motor.

SUMMARY

The object of this disclosure is to provide a mechanism capable of detection of a defect in connection between a motor control device and a three-phase motor without being affected by variation in characteristics of a power semiconductor or change of the resistance value of a wire.

According to one aspect of this disclosure, there is provided a motor control device including a current instruction generation unit for generating, in diagnosis of the connection of a motor line of a three-phase motor, a current instruction for causing equal currents to flow into two respective phases of the three-phase motor or a current instruction for causing a current to flow into one phase of the three-phase motor so that a current equal to a half of the current having flown in flows out from each of the remaining two phases.

The motor control device may further include an inverter for receiving a voltage instruction and for outputting a terminal voltage of the three-phase motor in accordance with the voltage instruction; a current control unit for detecting a current flowing in the three-phase motor and for outputting the voltage instruction in accordance with the difference between the current instruction received and the value of the current detected; and a connection defect detection unit for detecting a defect in the connection of the motor line, wherein the current instruction generation unit may generate, in diagnosis of the connection of the motor line, a direct current instruction for causing equal direct currents to flow into the two respective phases of the three-phase motor or a current instruction for causing a direct current to flow into one phase of the three-phase motor so that a current equal to a half of the current having flown in flows out from each of the remaining two phases, and the connection defect detection unit may compare the voltage instructions for the two phases out of those for three phases outputted from the current control unit while a current in accordance with the direct current instruction is being applied, to determine presence of a defect in connection of the motor line connecting the three-phase motor and the inverter in the case where there is a difference between the voltage instructions for the two phases.

The motor control device may further include a position control unit for outputting a current instruction to the current control unit to instruct that the three-phase motor should be positioned at a rotor angle equal to a specific angle; a numeric value control unit for outputting a target angle of the three-phase motor to the position control unit; and an angle calculation unit for calculating a rotor angle that causes no torque generation with the three-phase motor while the current in accordance with the direct current instruction is being applied, and outputs the rotor angle calculated to the position control unit in diagnosis of the connection of the motor line, and before application of the current in accordance with the direct current instruction for diagnosis of the connection of the motor line, the position control unit may place the three-phase motor in a position at the rotor angle that causes no torque generation upon application of the current in accordance with the direct current instruction to each phase of the three-phase motor.

The motor control device may further include a target position switching unit for switching a target position to a target position outputted from the angle calculation unit in the case where a first connection diagnostic signal is outputted from the numeric value control unit in diagnosis of a defect in connection, and to a target position outputted from the numeric value calculation unit in the case where the first connection diagnostic signal is not outputted; and a current instruction switching unit for switching a current instruction to a diagnostic current instruction outputted from the current instruction generation unit in the case where a second connection diagnostic signal is outputted from the numeric value control unit in diagnosis of a defect in connection, and to a current instruction outputted from the position control unit in the case where the second connection diagnostic signal is not outputted, and before application of the current in accordance with the direct current instruction for diagnosis of the connection of the motor line, the position control unit may place the three-phase motor in a position at the rotor angle that causes no torque generation upon application of the current in accordance with the direct current instruction to each phase of the three-phase motor.

In an embodiment in this disclosure, the numeric value control unit may further receive an operation of an operator and present control information relevant to the three-phase motor to the operator, the numeric value control unit may further include a display unit where to display an activation unit for shifting the state of the three-phase motor to the state for diagnosis of the connection of the motor line, a selection unit for selecting a three-phase motor to be a target of diagnosis of the connection of the motor line, and a start unit for starting an operation for diagnosis of the connection of the motor line relative to the three-phase motor selected with the selection unit, and with the activation unit pressed by the operator, the state of the three-phase motor may shift to the state for diagnosis of the connection of the motor line in which the selection unit and the start unit are displayed on the display unit, and with the start unit pressed by the operator, the operation for diagnosis of the connection of the motor line may begin.

In an embodiment of in this disclosure, before the operator presses the start unit, a message to the effect that the three-phase motor selected moves to a position at a diagnostic angle may be displayed on the display unit.

According to this disclosure, feedback current control is executed such that equal DC currents are caused to flow into two phases of a three-phase motor or a direct current is caused to flow into one phase of a three-phase motor so that a current equal to a half of the current having flown in flows out from each of the remaining two phases, and the voltage instructions are then compared with each other to see if there is any difference. When there is a difference, presence of a defect in connection between the motor control device and the three-phase motor is determined. This enables detection of a defect in connection between a motor control device and a three-phase motor without being affected by variation in characteristics of the power semiconductor or change of the resistance value of a wire.

BRIEF DESCRIPTION OF DRAWINGS

Embodiment(s) of this disclosure will be described based on the following figures, wherein.

DESCRIPTION OF EMBODIMENTS

Figure 1:
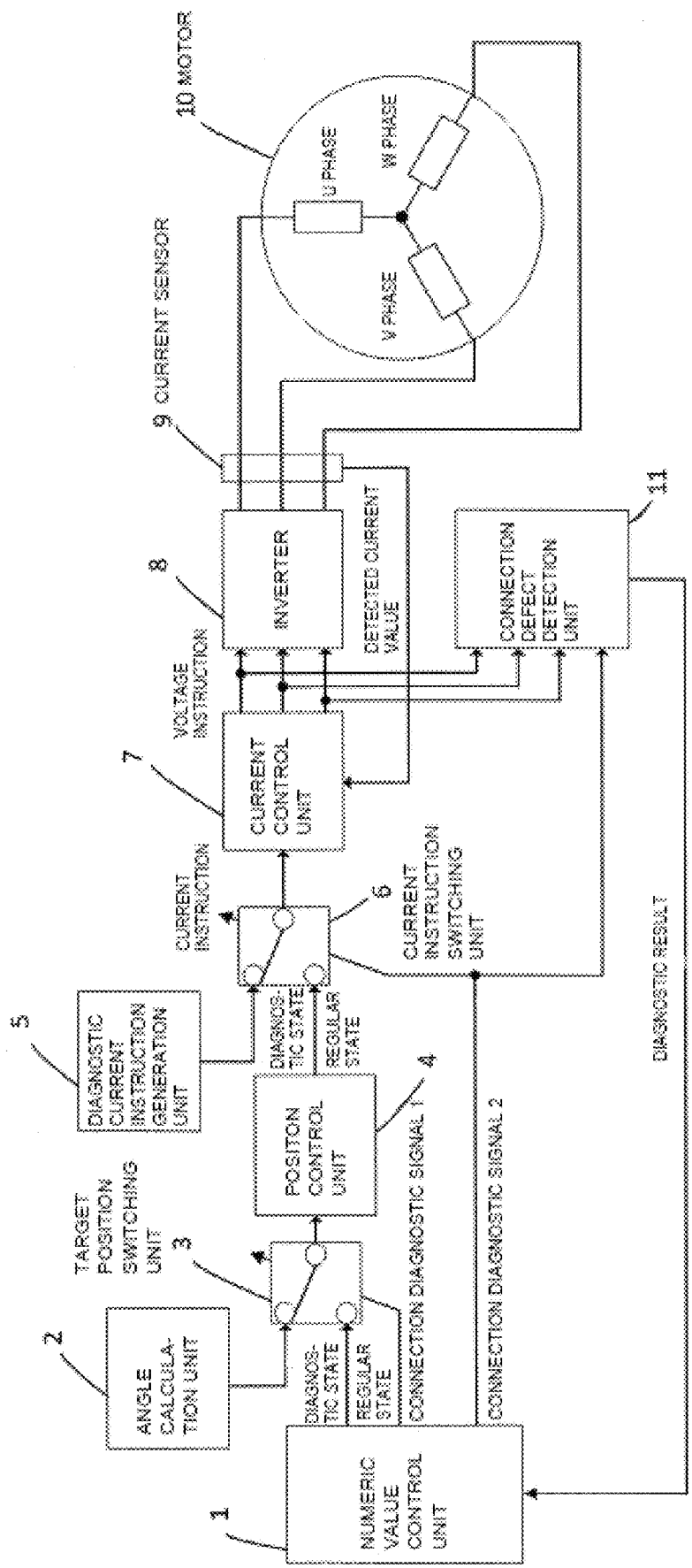
FIG. 1 is a block diagram illustrating the structure according to this embodiment.

The structure according to an embodiment in this disclosure will now be described referring to FIG. 1. FIG. 1 is a block diagram illustrating the structure according to an embodiment of this disclosure.

As illustrated in FIG. 1, a three-phase motor 10 is connected to an inverter 8 in this embodiment. Upstream of the inverter 8, there are connected a current control unit 7 for controlling a current to flow into the three-phase motor 10, a position control unit 4, and a numeric value control unit 1, or higher-order control systems.

A current sensor 9 is provided to an electric wire that connects the inverter 8 and the three-phase motor 10, and feeds a detected current value back to the current control unit 7. Based on a current instruction and the detected current value, the current control unit 7 obtains a voltage instruction, and outputs the voltage instruction to the inverter 8. Having received the voltage instruction, the inverter 8 outputs a terminal voltage of the three-phase motor 10 to drive the three-phase motor 10.

In diagnosis of the state of disconnection between the inverter 8 and the three-phase motor 10, the motor control device according to this embodiment places the three-phase motor 10 in a position at such an angle that causes no torque generation upon application of a diagnostic current to the three-phase motor 10, and thereafter causes equal currents to flow into two respective phases of the three-phase motor 10. Alternatively, the motor control device causes a current to flow into one phase of the three-phase motor 10 so that a current equal to a half of the current having flown in flows out from each of the remaining two phases.

An angle calculation unit 2 calculates an angle that causes no torque generation upon application of a diagnosis current to the three-phase motor 10, and outputs the value of the angle to a target position switching unit 3.

In a regular state in which no connection diagnostic signal 1 is inputted from the numeric value control unit 1, the target position switching unit 3 outputs the value of the target position inputted from the numeric value control unit 1 to the position control unit 4. Meanwhile, in a diagnostic state in which a connection diagnostic signal 1 is inputted, the target position switching unit 3 outputs the value of the target position inputted from the angle calculation unit 2 to the position control unit 4. Note that a connection diagnostic signal 1 corresponds to one example of "a first connection diagnostic signal".

A diagnostic current instruction generation unit 5 outputs a diagnostic current instruction for causing equal currents to flow into two respective phases of the three-phase motor 10, to a current instruction switching unit 6. Alternatively, the diagnostic current instruction generation unit 5 outputs a current instruction for causing a current to flow into one phase of the three-phase motor 10 so that a current equal to a half of the current having flown in flows out from each of the remaining two phases, to the current instruction switching unit 6.

In a regular state in which a connection diagnostic signal 2 is not inputted from the numeric value control unit 1, the current instruction switching unit 6 outputs to the current control unit 7 the current instruction inputted from the position control unit 4. Meanwhile, in a diagnostic state in which a connection diagnostic signal 2 is inputted, the current instruction switching unit 6 outputs to the current control unit 7 the diagnostic current instruction inputted from the diagnostic current instruction generation unit 5. Note that the connection diagnostic signal 2 corresponds to one example of "a second connection diagnostic signal".

In the case where the connection diagnostic signal 2 is inputted from the numeric value control unit 1, a connection defect detection unit 11 compares voltage instructions for two phases among those for the three phases, outputted from the current control unit 7. If there is any difference between the voltage instructions for these two phases, the connection defect detection unit 11 determines presence of a defect in connection.

The numeric value control unit 1 has a function of presenting control information concerning the three-phase motor 10 to an operator in response to an operation by the operator. For example, the numeric value control unit 1 has a display unit, such as a display. When an operator activates a motor line connection diagnostic function on the screen of the display unit, a user interface for executing the function according to this embodiment is displayed on the screen of the display unit. The operator then selects a motor to be a target of connection diagnosis, and then instructs start of diagnosis. Thereupon, a message "a three-phase motor for connection diagnosis will move to a position at a diagnostic angle" is displayed on the screen. Upon approval by the operator for start of the diagnosis, diagnosis of the motor line connection begins. After completion of the diagnosis, a result of detection by the connection defect detection unit 11 (that is, a result of connection diagnoses) is displayed on the screen.

For example, an activation unit, a selection unit, and a start unit are displayed on the display unit of the numeric value control unit 1.

The activation unit is a unit for shifting the state of the three-phase motor 10 to one for diagnosis of the connection of a motor line, and is an activation button, for example. With the activation button pressed by an operator, the state of the three-phase motor 10 shifts to one for diagnosis of the connection of a motor line, and the selection unit and the start unit are then displayed on the display unit.

The selection unit is a unit for selecting a three-phase motor 10 to be a target of diagnosis of the connection of a motor line, and is a selection button, for example. For example, a list of three-phase motors 10 is displayed on the display unit. When an operator selects any three-phase motor 10, and presses the selection button, the selected three-phase motor 10 is determined as a target of diagnosis of the connection of a motor line.

The start unit is a unit for starting an operation for diagnosis of the connection of a motor line with respect to the three-phase motor 10 selected with the selection unit, and is a start button, for example. With the start button pressed by an operator, an operation for diagnosis of the connection of a motor line begins with respect to the three-phase motor 10 selected with the selection button.

Figure 2:
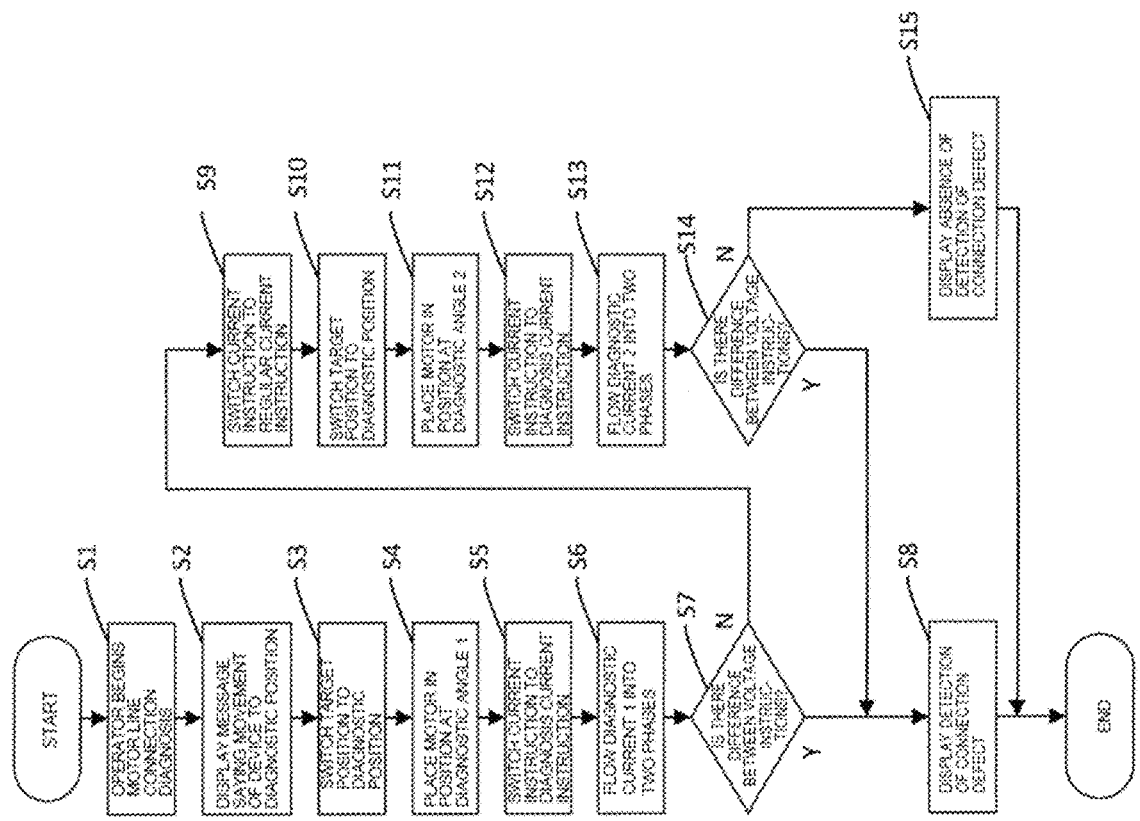
FIG. 2 is a flowchart of a method for detecting a defect in connection according to this embodiment.

Referring to FIG. 2, the operation of the structure according to this embodiment will now be described. FIG. 2 illustrates a flowchart for a method for detecting a defect in connection according to this embodiment.

Initially, an operator selects a three-phase motor 10 to be a target of connection diagnosis, and instructs start of diagnosis (step S1). Thereupon, a message "a three-phase motor for connection diagnosis will move to a position at a diagnostic angle" is displayed on the screen of the numeric value control unit 1 (step S2).

With approval by the operator for start of diagnosis, the numeric value control unit 1 outputs a connection diagnostic signal 1 to the target position switching unit 3. Having received the connection diagnostic signal 1, the target position switching unit 3 switches the target position to a position at a first angle that causes no torque generation upon application of a diagnostic current to the three-phase motor 10 (hereinafter referred to as "a diagnostic angle 1") (step S3). The value of the diagnostic angle 1 is outputted to the position control unit 4.

Having received the value of the diagnostic angle 1, the position control unit 4 places the three-phase motor 10 in a position at the diagnostic angle 1 (step S4).

In addition, the numeric value control unit 1 outputs the connection diagnostic signal 2 to the current instruction switching unit 6. Having received the connection diagnostic angle 2, the current instruction switching unit 6 switches the current instruction to a diagnostic current instruction (step S5), and outputs the diagnostic current instruction to the current control unit 7.

Following the diagnostic current instruction outputted from the current instruction switching unit 6, the current control unit 7 applies a diagnostic current 1 corresponding to the diagnostic angle 1 to the three-phase motor 10 (step S6).

The connection defect detection unit 11 compares the voltage instructions for two phases out of those for the three phases outputted from the current control unit 7, and determines presence of a defect in connection when there is any difference between the voltage instructions for these two phases (step S7). With a defect in connection detected in step S7 (Y at step S7), a message to the effect that a defect in connection has been detected is displayed on the screen of the numeric value control unit 1 (step S8).

Meanwhile, in the case where no defect in connection is detected in step S7 (N in step S7), the operation shifts to one for applying a diagnostic current to two other phases, so that the operation at step S9 and thereafter are executed.

The current instruction switching unit 6 switches the current instruction having been switched at step S5 to a regular current instruction (step S9).

The target position switching unit 3 switches the target position to a position at a second angle that causes no torque generation upon application of a diagnostic current to the three-phase motor 10 (hereinafter referred to as a "diagnostic angle 2") (step S10). The value of the diagnostic angle 2 is outputted to the position control unit 4.

Having received the value of the diagnostic angle 2, the position control unit 4 places the three-phase motor 10 in a position at the diagnostic angle 2 (step S11).

In addition, the numeric value control unit 1 outputs the connection diagnostic signal 2 to the current instruction switching unit 6. Having received the connection diagnostic signal 2, the current instruction switching unit 6 switches the current instruction to a diagnostic current instruction (step S12), and outputs the diagnostic current instruction to the current control unit 7.

Following the diagnostic current instruction outputted from the current instruction switching unit 6, the current control unit 7 applies to the three-phase motor 10 the diagnostic current 2 corresponding to the diagnostic angle 2 (step S13).

The connection defect detection unit 11 compares voltage instructions for two phases out of those for the three phases, outputted from the current control unit 7, and determines presence of a defect in connection when there is any difference between the voltage instructions for these two phases (step S14).

In the case where a defect in connection is detected at step S14 (Y at step S14), a message to the effect that a defect in connection has been detected is displayed on the screen of the numeric value control unit 1 (step S8).

Meanwhile, in the case where a defect in connection is not detected in step S14 (N in step S14), a message to the effect that no defect in connection has been detected is displayed on the screen of the numeric value control unit 1 (step S15).

Note that when equal currents are caused to flow to two phases of the three-phase motor 10 and voltage instructions are compared with each other to see if there is a difference between the voltage instructions, it is possible to detect a defect in connection. Thus, it is applicable to cause a current to flow to one phase of the three-phase motor 10 so that the current flows out from the second phase, and the absolute values of the voltage instruction values are compared with each other to see if there is a difference between the voltage instruction values. It is further applicable to cause equal currents to flow to the respective first and second phases of the three-phase motor 10 so that the current flows out from the third phase, and the voltage instructions for the first and second respective phases are compared with each other to see if there is a difference between the voltage instructions.

Note that a diagnostic current may be any specific current appropriate for measurement, being not limited to a direct current power source.

The invention claimed is:

1. A motor control device, comprising:
   a current instruction generation unit for generating, in diagnosis of connection of a motor line of a three-phase motor, a current instruction for causing equal currents to flow into two respective phases of the three-phase motor or a current instruction for causing a current to flow into one phase of the three-phase motor so that a current equal to a half of the current having flown in flows out from each of remaining two phases.

2. The motor control device according to claim 1, further comprising:
an inverter for receiving a voltage instruction and for outputting a terminal voltage of the three-phase motor in accordance with the voltage instruction;
a current control unit for detecting a current flowing in the three-phase motor and for outputting the voltage instruction in accordance with a difference between the current instruction received and a value of the current detected; and
a connection defect detection unit for detecting a defect in connection of the motor line,
wherein
the current instruction generation unit generates, in diagnosis of the connection of the motor line, a direct current instruction for causing equal direct currents to flow into the two respective phases of the three-phase motor or a current instruction for causing a direct current to flow into one phase of the three-phase motor so that a current equal to a half of the current having flown in flows out from each of remaining two phases, and
the connection defect detection unit compares voltage instructions for the two phases out of those for three phases outputted from the current control unit while a current in accordance with the direct current instruction is being applied, to determine presence of a defect in connection of the motor line connecting the three-phase motor and the inverter in a case where there is a difference between the voltage instructions for the two phases.

3. The motor control device according to claim 2, further comprising:
a position control unit for outputting a current instruction to the current control unit to instruct that the three-phase motor is positioned at a rotor angle equal to a specific angle;
a numeric value control unit for outputting a target angle of the three-phase motor to the position control unit; and
an angle calculation unit for calculating a rotor angle that causes no torque generation with the three-phase motor while the current in accordance with the direct current instruction is being applied, and outputs the rotor angle calculated to the position control unit in diagnosis of the connection of the motor line,
wherein
before application of the current in accordance with the direct current instruction for diagnosis of the connection of the motor line, the position control unit places the three-phase motor in a position at the rotor angle that causes no torque generation upon application of the current in accordance with the direct current instruction to each phase of the three-phase motor.

4. The motor control device according to claim 3, further comprising:
a target position switching unit for switching a target position to a target position outputted from the angle calculation unit in a case where a first connection diagnostic signal is outputted from the numeric value control unit in diagnosis of a defect in connection, and to a target position outputted from the numeric value calculation unit in a case where the first connection diagnostic signal is not outputted; and
a current instruction switching unit for switching a current instruction to a diagnostic current instruction outputted from the current instruction generation unit in a case where a second connection diagnostic signal is outputted from the numeric value control unit in diagnosis of a defect in connection, and to a current instruction outputted from the position control unit in a case where the second connection diagnostic signal is not outputted,
wherein
before application of the current in accordance with the direct current instruction for diagnosis of the connection of the motor line, the position control unit places the three-phase motor in a position at the rotor angle that causes no torque generation upon application of the current in accordance with the direct current instruction to each phase of the three-phase motor.

5. The motor control device according to claim 3, wherein
the numeric value control unit further receives an operation of an operator and presents control information relevant to the three-phase motor to the operator,
the numeric value control unit further includes a display unit where to display an activation unit for shifting a state of the three-phase motor to a state for diagnosis of the connection of the motor line, a selection unit for selecting a three-phase motor to be a target of diagnosis of the connection of the motor line, and a start unit for starting an operation for diagnosis of the connection of the motor line relative to the three-phase motor selected with the selection unit, and
with the activation unit pressed by the operator, the state of the three-phase motor shifts to the state for diagnosis of the connection of the motor line in which the selection unit and the start unit are displayed on the display unit, and
with the start unit pressed by the operator, the operation for diagnosis of the connection of the motor line begins.

6. The motor control device according to claim 5, wherein before the operator presses the start unit, a message to an effect that the three-phase motor selected moves to a position at a diagnostic angle is displayed on the display unit.

* * * * *